(12) United States Patent
Kao et al.

(10) Patent No.: US 11,470,732 B2
(45) Date of Patent: Oct. 11, 2022

(54) CUSHIONING ELEMENT AND ELECTRONIC DEVICE HAVING THE SAME

(71) Applicant: Wiwynn Corporation, New Taipei (TW)

(72) Inventors: Cheng-Sen Kao, New Taipei (TW); Yuan-Shiang Ding, New Taipei (TW); Chun-Wei Chen, New Taipei (TW)

(73) Assignee: WIWYNN CORPORATION, New Taipei (TW)

( * ) Notice: Subject to any disclaimer, the term of this patent is extended or adjusted under 35 U.S.C. 154(b) by 43 days.

(21) Appl. No.: 17/122,130

(22) Filed: Dec. 15, 2020

(65) Prior Publication Data

US 2022/0095465 A1 Mar. 24, 2022

(30) Foreign Application Priority Data

Sep. 18, 2020 (TW) .................................. 109132477

(51) Int. Cl.
*H05K 5/00* (2006.01)
(52) U.S. Cl.
CPC ........... *H05K 5/0052* (2013.01); *H05K 5/006* (2013.01)
(58) Field of Classification Search
None
See application file for complete search history.

(56) References Cited

U.S. PATENT DOCUMENTS

| 6,399,888 | B1 * | 6/2002 | Chen ...................... H05K 7/142 |
| | | | 411/501 |
| 6,445,588 | B1 * | 9/2002 | Masterton ............ H05K 7/1405 |
| | | | 361/752 |
| 6,898,087 | B1 * | 5/2005 | Chen ................... H01R 13/2407 |
| | | | 361/742 |
| 9,622,394 | B1 * | 4/2017 | Frank .................... H05K 5/0026 |
| 2003/0002270 | A1 * | 1/2003 | Kitadai ................ H05K 5/0286 |
| 2014/0092548 | A1 * | 4/2014 | Lee ......................... G11B 33/08 |
| | | | 361/679.34 |
| 2015/0359115 | A1 * | 12/2015 | Hirano ................... G11B 33/08 |
| | | | 361/679.34 |

FOREIGN PATENT DOCUMENTS

| CN | 206555339 U | * 10/2017 |
| CN | 206555339 U | 10/2017 |

* cited by examiner

*Primary Examiner* — James Wu
*Assistant Examiner* — Christopher L Augustin
(74) *Attorney, Agent, or Firm* — McClure, Qualey & Rodack, LLP

(57) ABSTRACT

A cushioning element includes a hollow elastic body, a plurality of first columns, and a plurality of second columns. The hollow elastic body includes a first side wall and a second side wall, where the first side wall includes a first inner surface, the second side wall includes a second inner surface. The first columns are disposed on the first inner surface, where each first column includes a first extending end and a first side surface, and there is a first distance between the first extending end and the second inner surface. The second columns are disposed on the second inner surface, where each second column includes a second extending end and a second side surface, there is a second distance between the second extending end and the first inner surface, and the second side surface and the first side surface are at least partially in contact with each other.

20 Claims, 8 Drawing Sheets

CUSHIONING ELEMENT AND ELECTRONIC DEVICE HAVING THE SAME

CROSS-REFERENCE TO RELATED APPLICATION

This non-provisional application claims priority under 35 U.S.C. § 119(a) to Patent Application No. 109132477 in Taiwan, R.O.C. on Sep. 18, 2020, the entire contents of which are hereby incorporated by reference.

BACKGROUND

Technical Field

The instant disclosure relates to a cushioning element, and in particular, to a cushioning element for improving a cushioning effect by using a column and an electronic device having the same.

RELATED ART

Many products use cushioning elements for protection. For example, the cushioning elements may be configured to: reduce impact forces on the products from the outside, reduce acting forces between internal elements of the products, absorb vibrations generated by operation of the elements, or the like.

Currently, most cushioning elements commonly used in the market are solid rubber blocks or foam. However, when being impacted by an object, the solid rubber blocks cannot effectively absorb impact energy but generate an excessive rebound reacting force, resulting in an excessively high rebound acceleration value of the object under the force. Therefore, when the object rebounds to strike another element, it is easy to damage or deform the object or the another element. The foam is prone to wear during use to lose the cushioning effect.

SUMMARY

In view of the above, in some embodiments, the instant disclosure provides a cushioning element, including a hollow elastic body, a plurality of first columns, and a plurality of second columns. The hollow elastic body includes a first side wall and a second side wall opposite to each other, where the first side wall includes a first inner surface, and the second side wall includes a second inner surface. The plurality of first columns are disposed on the first inner surface and extend toward the second inner surface, where each first column includes a first extending end and a first side surface, and there is a first distance between the first extending end and the second inner surface. The plurality of second columns are disposed on the second inner surface and extend toward the first inner surface, where each second column includes a second extending end and a second side surface, there is a second distance between the second extending end and the first inner surface, and the second side surface and the first side surface are at least partially in contact with each other.

In another embodiment, the instant disclosure provides an electronic device, including a housing, a circuit board, and a cushioning element. The housing includes a connection portion. The circuit board is assembled in the housing, and the circuit board includes a side edge adjacent to the connection portion. The cushioning element is disposed between the side edge of the circuit board and the connection portion, and the cushioning element includes a hollow elastic body, a plurality of first columns, and a plurality of second columns. The hollow elastic body includes a first side wall and a second side wall opposite to each other, where the first side wall includes a first inner surface, the second side wall includes a second inner surface, the first side wall is in contact with the side edge, and the second side wall is fixed to the connection portion. The plurality of first columns are disposed on the first inner surface and extend toward the second inner surface, where each first column includes a first extending end and a first side surface, and there is a first distance between the first extending end and the second inner surface. The plurality of second columns are disposed on the second inner surface and extend toward the first inner surface, where each second column includes a second extending end and a second side surface, there is a second distance between the second extending end and the first inner surface, and the second side surface and the first side surface are at least partially in contact with each other.

As above, according to the cushioning element of the embodiments of the instant disclosure, the hollow elastic body is in a hollow shape and the first side surface of the each first column and the second side surface of the each second column are at least partially in contact with each other, so that when the cushioning element is compressed by an impact of an object, a damping effect can be generated through deformation of the hollow elastic body and mutual friction between the first column and the second column, to effectively absorb an impact force and greatly reduce a rebound reacting force, thereby reducing a rebound acceleration value of the object, to avoid damage or deformation of the object or another element caused by rebound of the object on the another element. The cushioning element is also less prone to wear and the service life is prolonged.

DETAILED DESCRIPTION

Figure 1:
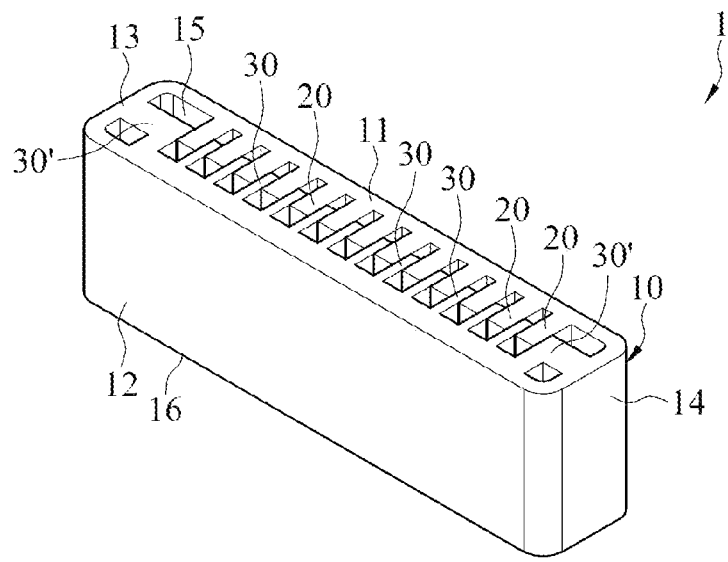
FIG. 1 illustrates a three-dimensional view of a first embodiment of a cushioning element according to the instant disclosure.
Figure 2:
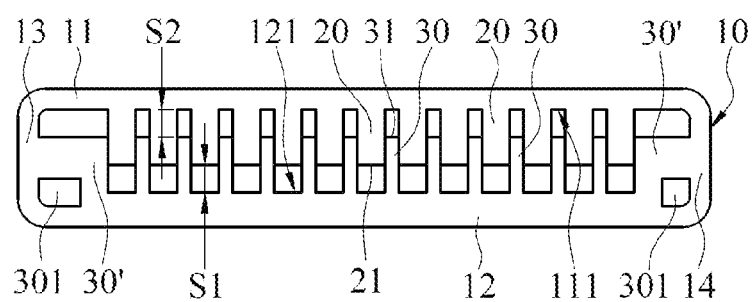
FIG. 2 illustrates a side view of the first embodiment of the cushioning element according to the instant disclosure.
Figure 3:
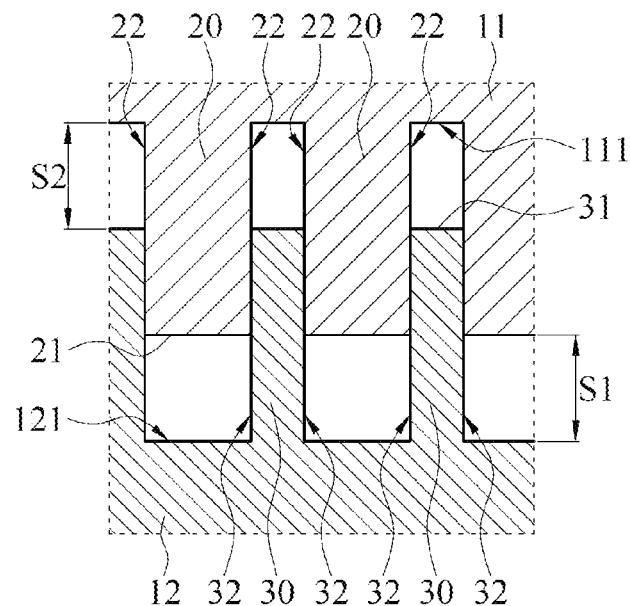
FIG. 3 illustrates a partial enlarged view of the first embodiment of the cushioning element according to the instant disclosure.

FIG. 1 is a three-dimensional view of a first embodiment of a cushioning element according to the instant disclosure. FIG. 2 is a side view of the first embodiment of the cushioning element according to the instant disclosure. FIG. 3 is a partial enlarged view of the first embodiment of the cushioning element according to the instant disclosure. As shown in FIG. 1 to FIG. 3, the cushioning element 1 includes a hollow elastic body 10, first columns 20, and second columns 30. The first columns 20 and the second columns 30 in FIG. 3 are filled with different fill lines respectively, to clearly distinguish boundaries between the first columns and the second columns (FIG. 5 to FIG. 8 are in the same way). Description is first made herein.

In some embodiments, the cushioning element 1 may be applied to various types of products, to reduce impact forces on the products from the outside, reduce acting forces between internal elements of the products, absorb vibrations generated by operation of the elements, or the like. For example, the products may be electronic products (such as servers, computers, household appliances, steam locomotives, or other consumer electronic products) or mechanical products (such as processing machines, conveyors or packaging machines), or the cushioning element 1 may be packaging materials for the products.

As shown in FIG. 1 and FIG. 2, the hollow elastic body 10 may be made of an elastic material, for example, the elastic material may be a thermoset elastomer (rubber) or a thermoplastic elastomer (TPE). The elasticity refers to an ability that the material is deformed after being subject to an external force and returns to the original shape after the external force is removed. In some embodiments, the hollow elastic body 10 is in a hollow annular shape, and a shape of the hollow elastic body 10 may be a square, a rectangle, an ellipse, a circle or another irregular shape, and is not limited herein.

As shown in FIG. 1 and FIG. 2, in this embodiment, the hollow elastic body 10 is in a rectangular shape and includes a first side wall 11 and a second side wall 12 opposite to each other, and a third side wall 13 and a fourth side wall 14 opposite to each other. The third side wall 13 and the fourth side wall 14 are connected between the first side wall 11 and the second side wall 12, constituting a surround of the first side wall 11, the second side wall 12, the third side wall 13, and the fourth side wall 14 to form the hollow elastic body 10 in a hollow shape, and causing the hollow elastic body 10 to form a first opening side 15 and a second opening side 16 that are opposite to each other and are not closed.

As shown in FIG. 1 to FIG. 3, the first side wall 11 of the hollow elastic body 10 includes a first inner surface 111, the second side wall 12 includes a second inner surface 121, and there is a distance between the first inner surface 111 and the second inner surface 121. There are a plurality of first columns 20 of the cushioning element 1, which are disposed on the first inner surface 111 of the first side wall 11. For example, in this embodiment, the plurality of first columns 20 are arranged at intervals and are disposed on the first inner surface 111 (herein, the plurality of first columns 20 are arranged in a row), each first column 20 extends toward the second inner surface 121, and the each first column 20 includes a first extending end 21 and at least one first side surface 22. The first extending end 21 is an end of the first column 20 far away from the first inner surface 111, the first side surface 22 is a side surface of the first column 20 that is located between the first extending end 21 and the first inner surface 111, there is a first distance S1 between the first extending end 21 and the second inner surface 121, and the first extending end and the second inner surface are not in contact with each other.

In some embodiments, the each first column 20 may be a square column, a circular column, an elliptical column, an elongated column, or a column in another shape. The quantity of first side surfaces 22 depends on the shape of the first column 20. For example, if the first column 20 is a square column or an elongated column, there are a plurality of first side surfaces 22, and if the first column 20 is a circular column or an elliptical column, there is one first side surface 22, and the one first side surface has an annular surface.

Figure 4:
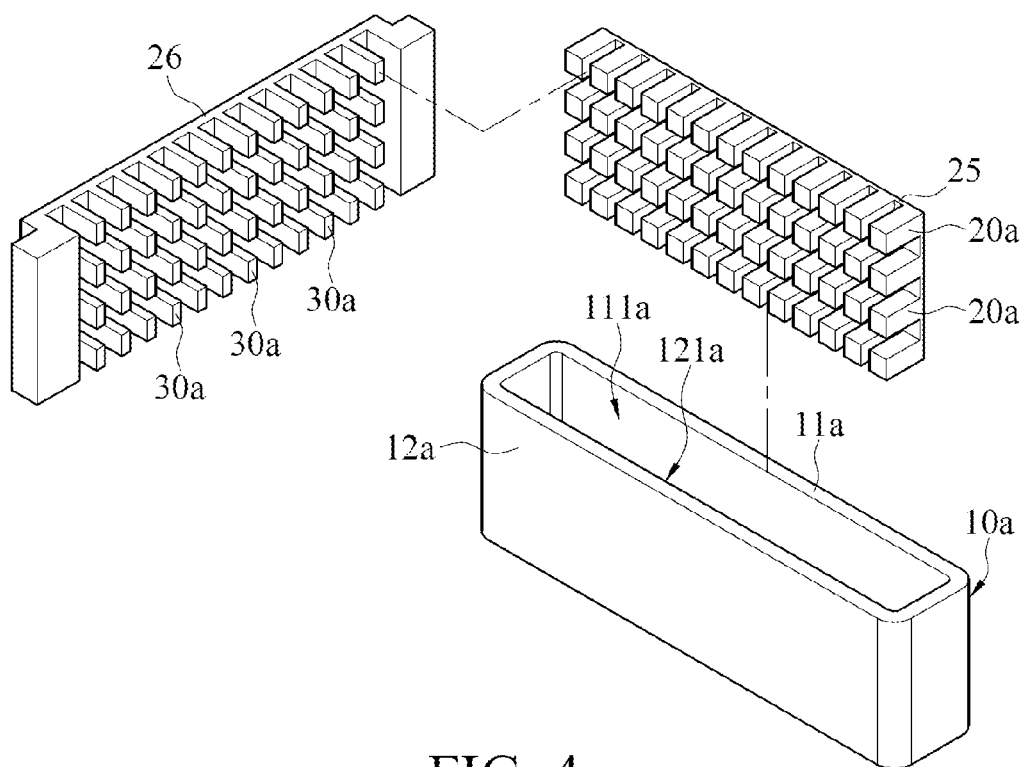
FIG. 4 illustrates an exploded three-dimensional view of a second embodiment of the cushioning element according to the instant disclosure.

In some embodiments, the first columns 20 and the hollow elastic body 10 may be of a one-piece structure (referring to FIG. 1 and FIG. 2) or an assembled structure (referring to FIG. 4). For example, in the manufacturing process of the cushioning element 1, a solid elastic body (for example, a solid rubber body) may be cut through mechanical processing to form the hollow elastic body 10 and the first columns 20 that are integrally manufactured. Alternatively, the hollow elastic body 10 and the first columns 20 may be separately manufactured. The plurality of first columns 20 are then assembled to the inside of the hollow elastic body 10 and are fixed to the first inner surface 111.

In some embodiments, the shapes or sizes (for example, lengths or widths) of the plurality of first columns 20 may be all the same, all different or partially the same, which depends on the products to which the cushioning element 1 is applied. For example, in the embodiment of FIG. 1 to FIG. 3, the shapes and sizes of the plurality of first columns 20 are all the same.

As shown in FIG. 1 to FIG. 3, there are a plurality of second columns 30 of the cushioning element 1, which are disposed on the second inner surface 121. For example, in this embodiment, the plurality of second columns 30 are arranged at intervals and are disposed on the second inner surface 121 (herein, the plurality of second columns 30 are arranged in a row), and the plurality of second columns 30 and the plurality of first column s 20 are alternately disposed. Each second column 30 extends toward the first inner surface 111, and the each second column 30 includes a second extending end 31 and at least one second side surface 32. The second extending end 31 is an end of the second column 30 far away from the second inner surface 121, the second side surface 32 is a side surface of the second column 30 that is located between the second extending end 31 and the second inner surface 121, there is a second distance S2 between the second extending end 31 and the first inner surface 111, and the second extending end and the first inner surface are not in contact with each other. Therefore, with the first distance S1 between the first extending end 21 of the each first column 20 and the second inner surface 121 and the second distance S2 between the second extending end 31 of the each second column 30 and the first inner surface 111, when the first side wall 11 is impacted by an external force, the first side wall 11 and the each first column 20 can move closer toward the second inner surface 121 to compress the hollow elastic body 10. In addition, if there is a larger external force, the each first column 20 may be in contact with the second inner surface 121, changing the first distance S1 to 0. When the second side wall 12 is impacted by an external force, the second side wall 12 and the each second column 30 can move closer toward the first inner surface 111 to compress the hollow elastic body 10. In addition, if there is a larger external force, the each second column 30 may be in contact with the first inner surface 111, changing the second distance S2 to 0.

In some embodiments, the each second column 30 may be a square column, a circular column, an elliptical column, an elongated column, or a column in another shape. The quantity of second side surfaces 32 depends on the shape of the second column 30. For example, if the second column 30 is a square column or an elongated column, there are a plurality of second side surfaces 32, and if the second column 30 is a circular column or an elliptical column, there is one second side surface 32, and the one second side surface has an annular surface.

In some embodiments, the second columns 30 and the hollow elastic body 10 may be of a one-piece structure (referring to FIG. 1 and FIG. 2) or an assembled structure (referring to FIG. 4). For example, in the manufacturing process of the cushioning element 1, a solid elastic body (for example, a solid rubber body) may be cut through mechanical processing to form the hollow elastic body 10 and the second columns 30 that are integrally manufactured. Alternatively, the hollow elastic body 10 and the second columns 30 may be separately manufactured. The plurality of second columns 30 are then assembled to the inside of the hollow elastic body 10 and are fixed to the second inner surface 121.

In some embodiments, the shapes or sizes (for example, lengths or widths) of the plurality of second columns 30 may be all the same, all different or partially the same. For example, in the embodiment of FIG. 1 to FIG. 3, the plurality of second columns 30 include two second columns 30' closest to the third side wall 13 and the fourth side wall 14, and the shapes and sizes of the two second columns 30' are different from the shapes and sizes of other second columns 30. In addition, the shapes or sizes (for example, lengths or widths) of the plurality of first columns 20 and the plurality of second columns 30 may be all the same, all different or partially the same. For example, in the embodiment of FIG. 1 to FIG. 3, the sizes of the first columns 20 and the second columns 30 are all different (herein, the widths of the first columns 20 are greater than the widths of the second columns 30).

As shown in FIG. 1 to FIG. 3, the first side surface 22 of the first column 20 and the second side surface 32 of the second column 30 that are adjacent to each other are in further contact with each other. As shown in FIG. 3, in this embodiment, both the first side surface 22 of the each first column 20 and the second side surface 32 of the each second column 30 are planar and are fitted to each other. Therefore, when the first side wall 11 or the second side wall 12 is impacted by an external object to compress the hollow elastic body 10, the each first column 20 and the each second column 30 may move relative to each other. For example, the each first column 20 moves closer toward the second inner surface 121 or the each second column 30 moves closer toward the first inner surface 111, so that portions of the plurality of first side surfaces 22 and the plurality of second side surfaces 32 that are in contact with each other rub against each other to generate a damping effect. In addition, the side walls (the first side wall 11, the second side wall 12, the third side wall 13, and the fourth side wall 14) of the hollow elastic body 10 may be simultaneously stressed to be deformed to enhance the damping effect, to effectively absorb an impact force and greatly reduce a rebound reacting force, so that a rebound acceleration value of the object is reduced, to avoid damage or deformation of the object or another element caused by rebound of the object on the another element. In addition, through the enhancement of the damping effect, the cushioning element 1 is also less prone to wear and the service life is prolonged.

For example, under the same impact condition, it is assumed that after a solid rubber block is impacted by an object, a rebound acceleration value of the object is 60 g, and the cushioning element 1 of the embodiments of the instant disclosure may reduce the rebound acceleration value by at least 50% through deformation of the hollow elastic body 10 and mutual friction between the each first column 20 and the each second column 30. For example, after the cushioning element 1 is impacted by an object, a rebound acceleration value of the object may be reduced to 14 g to 30 g, to avoid damage or deformation of the object or another element caused by rebound of the object on the another element.

In some embodiments, as shown in FIG. 1 to FIG. 3, the each first column 20 and the each second column 30 may be in a long strip shape and extend from the first opening side 15 to the second opening side 16. Therefore, a contact area between the first side surface 22 of the each first column 20 and the second side surface 32 of the each second column 30 may be increased, so that when the first side wall 11 or the second side wall 12 of the cushioning element 1 is impacted by an external object to compress the hollow elastic body 10, a friction force between the each first column 20 and the each second column 30 can be increased to enhance the damping effect, to further reduce the rebound acceleration value of the object.

In some embodiments, both the thickness of the hollow elastic body 10 of the cushioning element 1 and the sizes (for example, lengths, widths, or heights) or quantity of first columns 20, or the sizes (for example, lengths, widths, or heights) or quantity of second columns 30 affect the damping effect generated when the cushioning element 1 is impacted. Therefore, the sizes or quantity of hollow elastic bodies 10, first columns 20 or second columns 30 of the cushioning element 1 may be adjusted according to different product specifications (such as a product weight, space or size), to optimize the design.

Further, as shown in FIG. 1 and FIG. 2, two second columns 30' of the plurality of second columns 30 of the cushioning element 1 closest to the third side wall 13 and the fourth side wall 14 are further connected to the third side wall 13 and the fourth side wall 14 respectively. Therefore, the structural strength of the third side wall 13 and the fourth side wall 14 may be further enhanced, to ensure that the third side wall 13 and the fourth side wall 14 can rebound and return to the original shape after being stressed and deformed, to prolong the service life of the cushioning element 1. In some embodiments, an overall volume of the two second columns 30' may be greater than an overall volume of the other second columns 30, to further enhance the structural strength of the third side wall 13 and the fourth side wall 14.

In some embodiments, as shown in FIG. 2, each second column 30' connected to the third side wall 13 and the fourth side wall 14 may further include a slot 301, so that when the third side wall 13 and the fourth side wall 14 are stressed and deformed, the each second column 30' may be simultaneously deformed based on the slot 301, to enhance the absorption of the impact force to improve the damping effect, and help the third side wall 13 and the fourth side wall 14 to return to the original shape after the external force is removed.

In some embodiments, two of the plurality of first columns 20 of the cushioning element 1 closest to the third side wall 13 and the fourth side wall 14 may alternatively be connected to the third side wall 13 and the fourth side wall 14, and are not limited to the foregoing two second columns 30'.

In some embodiments, the plurality of first columns 20 may alternatively be disposed on the first inner surface 111 in a two-dimensional arrangement to form a two-dimensional array, and the plurality of second columns 30 may alternatively be disposed on the second inner surface 121 in a two-dimensional arrangement to form a two-dimensional array. FIG. 4 is an exploded three-dimensional view of a second embodiment of the cushioning element according to the instant disclosure. In this embodiment, a hollow elastic body 10a, a plurality of first columns 20a, and a plurality of second columns 30a may be of an assembled structure. For example, the plurality of first columns 20a may cut a solid elastic body through mechanical processing to form a two-dimensional array on a first substrate 25, the plurality of second columns 30a may cut a solid elastic body through mechanical processing to form a two-dimensional array on a second substrate 26, then, the first substrate 25 is fixed on a first inner surface 111a of the first side wall 11a of the hollow elastic body 10a, so that the plurality of first columns 20a are disposed on the first inner surface 111a in a two-dimensional arrangement, and the second substrate 26 is fixed on a second inner surface 121a of the second side wall 12a of the hollow elastic body 10a, so that the plurality of second columns 30a are disposed on the second inner surface 121a in a two-dimensional arrangement, and the plurality of first columns 20a and the plurality of second columns 30a are alternately disposed.

In some embodiments, at least one of the first side surface 22 of the first column 20 and the second side surface 32 of the second column 30 that are in contact with each other may be further provided with a microstructure to increase the damping effect. There are a plurality of implementations (as shown in FIG. 5 to FIG. 8) of the microstructure, and descriptions are made below with reference to the drawings respectively.

Figure 5:
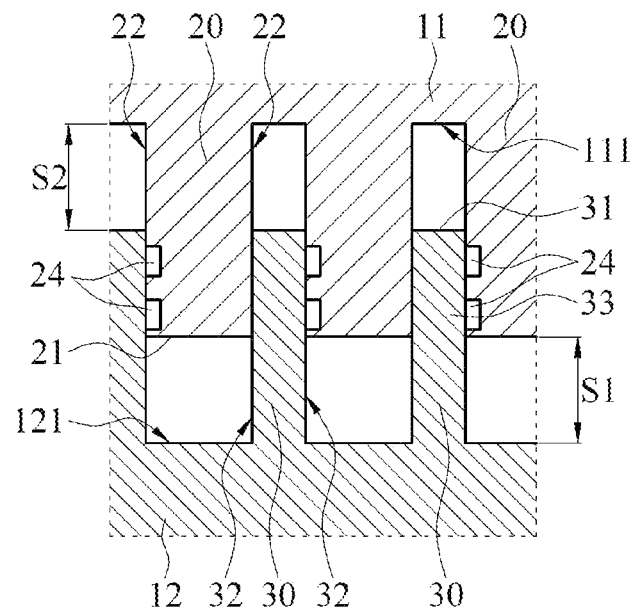
FIG. 5 illustrates a partial enlarged view of a third embodiment of the cushioning element according to the instant disclosure.

FIG. 5 is a partial enlarged view of a third embodiment of the cushioning element according to the instant disclosure. In some embodiments, the first side surface 22 of the first column 20 may be provided with a pattern 24. The pattern 24 may be a groove pattern (as shown in FIG. 5) or a protrusion pattern. Therefore, when the first side wall 11 or the second side wall 12 is impacted by an external object to enable the first column 20 and the second column 30 to move relative to each other, a frictional damping effect may be increased by using the pattern 24, to enhance the absorption of an impact force and further reduce a rebound acceleration value of the object.

However, the foregoing embodiments are merely examples. In some embodiments, the pattern 24 may alternatively be disposed on the second side surface 32 of the second column 30, or both the first side surface 22 of the first column 20 and the second side surface 32 of the second column 30 may be provided with the pattern 24, to increase the frictional damping effect.

Figure 6:
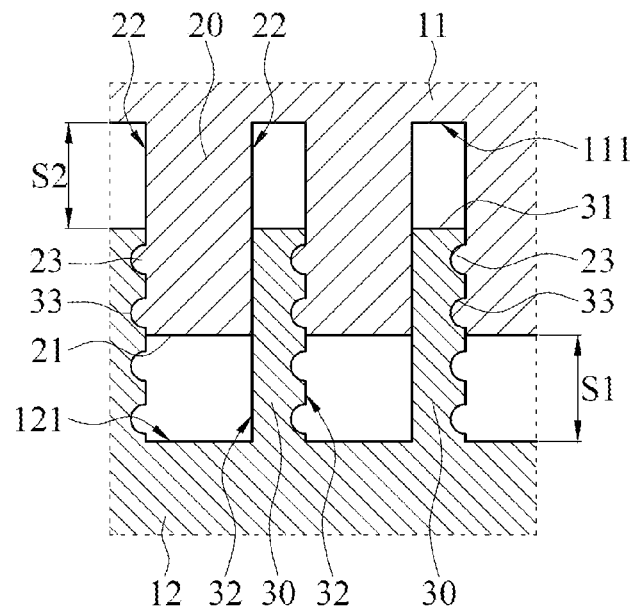
FIG. 6 illustrates a partial enlarged view of a fourth embodiment of the cushioning element according to the instant disclosure.

FIG. 6 is a partial enlarged view of a fourth embodiment of the cushioning element according to the instant disclosure. In some embodiments, a plurality of convex portions 23 are disposed on the first side surface 22 of the first column 20 and are arranged on the first side surface 22 in an extending direction of the first column 20. The shape of the convex portion 23 may be a semicircle (as shown in FIG. 6), an arc, a square, a rectangle, a trapezoid, or another irregular shape, and is not limited herein. Therefore, when the first side wall 11 or the second side wall 12 is impacted by an external object to enable the first column 20 and the second column 30 to move relative to each other, the frictional damping effect may be increased by using the convex portions 23.

As shown in FIG. 6, in some embodiments, a plurality of concave portions 33 may be disposed on the second side surface 32 of the second column 30 to fit with the convex portions 23. Herein, a plurality of concave portions 33 are arranged on the second side surface 32 in an extending direction of the second column 30. The quantity of the concave portions 33 may be greater than or equal to the quantity of the convex portions 23, and the plurality of convex portions 23 are detachably accommodated in the corresponding concave portions 33 respectively. Therefore, when the first side wall 11 or the second side wall 12 is impacted by an external object to enable the first column 20 and the second column 30 to move relative to each other, the frictional damping effect may be further increased through interference between the convex portions 23 and the concave portions 33.

However, the foregoing embodiments are merely examples. In some embodiments, the convex portions 23 may alternatively be disposed on the second side surface 32 of the second column 30, and the concave portions 33 may be disposed on the first side surface 22 of the first column 20.

Figure 7:
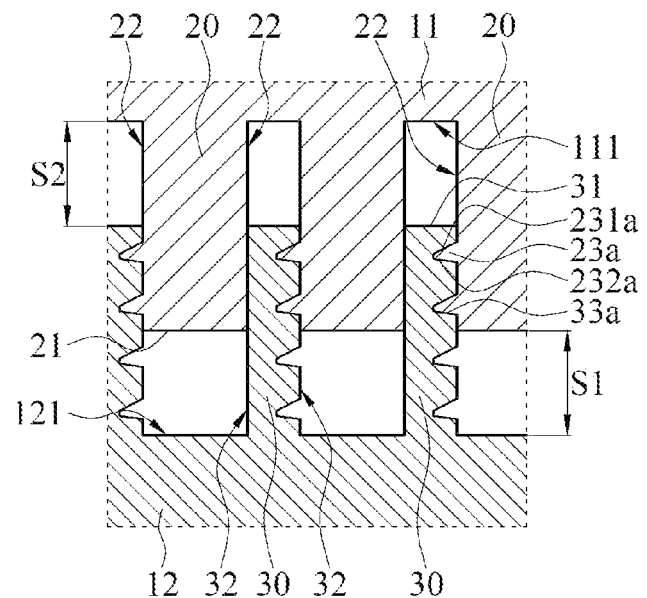
FIG. 7 illustrates a partial enlarged view of a fifth embodiment of the cushioning element according to the instant disclosure.

FIG. 7 is a partial enlarged view of a fifth embodiment of the cushioning element according to the instant disclosure. A difference between this embodiment and the embodiment of FIG. 6 is that, a concave portion 23a on the first side surface 22 of the first column 20 is a polygon (a non-isosceles trapezoid herein) and includes a first inclined plane 231a and a second inclined plane 232a, and the first inclined plane 231a is adjacent to the first inner surface 111 relative to the second inclined plane 232a. The first inclined plane 231a and the second inclined plane 232a are inclined planes, and an inclination of the first inclined plane 231a is different from an inclination of the second inclined plane 232a. The shape of each concave portion 33a on the second side surface 32 of the second column 30 may correspond to the shape of each convex portion 23a. For example, as shown in FIG. 7, in this embodiment, the inclination of the first inclined plane 231a is greater than the inclination of the second inclined plane 232a. Therefore, because the second inclined plane 232a has a smaller inclination, in the process that the first side wall 11 is impacted by an external object to enable the each first column 20 to move closer toward the second inner surface 121, a larger resistance is generated between the convex portions 23a and the concave portions 33a to increase the damping effect, to enhance the absorption of an impact force and further reduce a rebound reacting force. In addition, because the first inclined plane 231a has a larger inclination, in the process that the first side wall 11 removes the external force to enable the hollow elastic body 10 to rebound and return to the original shape, there is a smaller resistance between the convex portions 23a and the concave portions 33a, to help the hollow elastic body 10 rebound.

Figure 8:
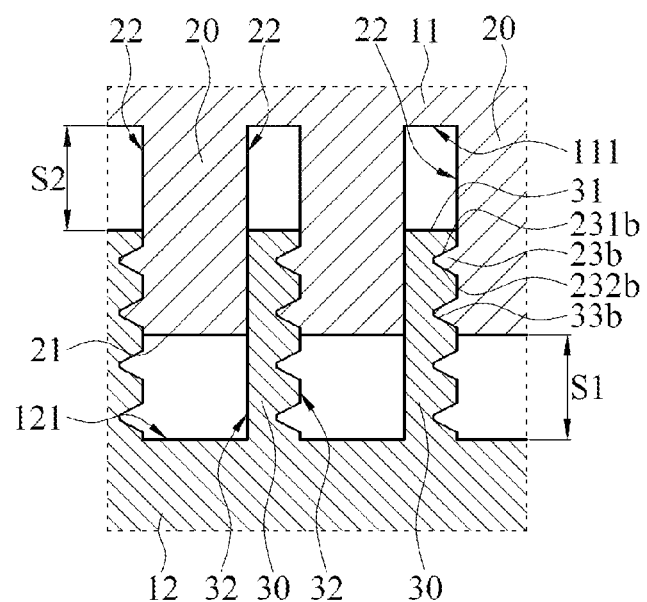
FIG. 8 illustrates a partial enlarged view of a sixth embodiment of the cushioning element according to the instant disclosure.

FIG. 8 is a partial enlarged view of a sixth embodiment of the cushioning element according to the instant disclosure. In this embodiment, a convex portion 23b on the first side surface 22 of the first column 20 is a polygon (an isosceles trapezoid herein) and includes a first inclined plane 231b and a second inclined plane 232b, and the first inclined plane 231b is adjacent to the first inner surface 111 relative to the second inclined plane 232b. The first inclined plane 231b and the second inclined plane 232b are inclined planes. A difference between this embodiment and the embodiment of FIG. 7 is that, an inclination of the first inclined plane 231b is the same as an inclination of the second inclined plane 232b, and the shape of each concave portion 33b on the second side surface 32 of the second column 30 corresponds to the shape of each convex portion 23b. Therefore, compared with the embodiment of FIG. 3, when the first side wall 11 or the second side wall 12 is impacted by an external object to enable the first column 20 and the second column 30 to move relative to each other, a resistance between the convex portions 23b and the concave portions 33b may be further generated to increase the damping effect, to enhance the absorption of an impact force to reduce a rebound reacting force.

Figure 9:
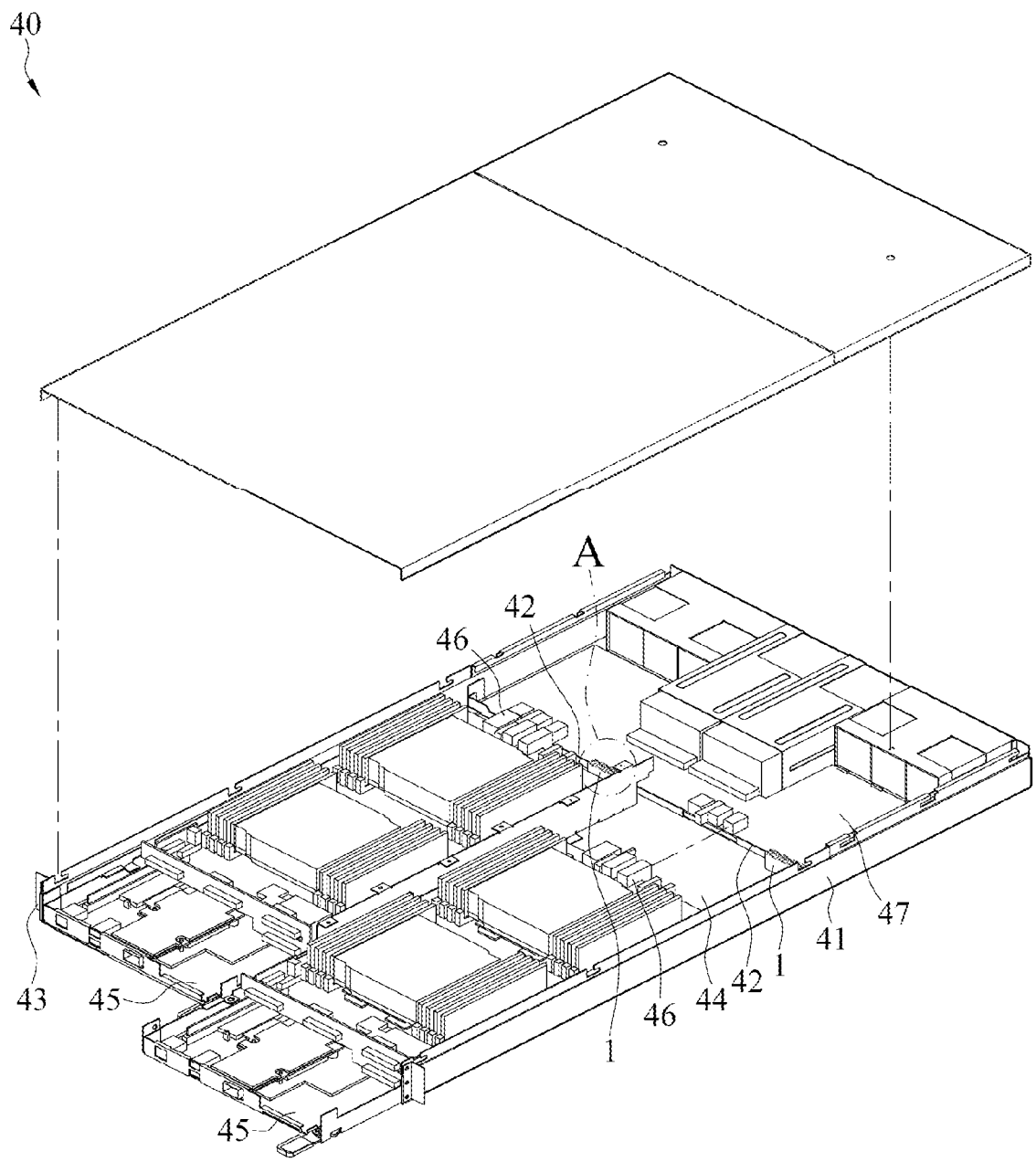
FIG. 9 illustrates an exploded three-dimensional view of an embodiment of an electronic device according to the instant disclosure.
Figure 10:
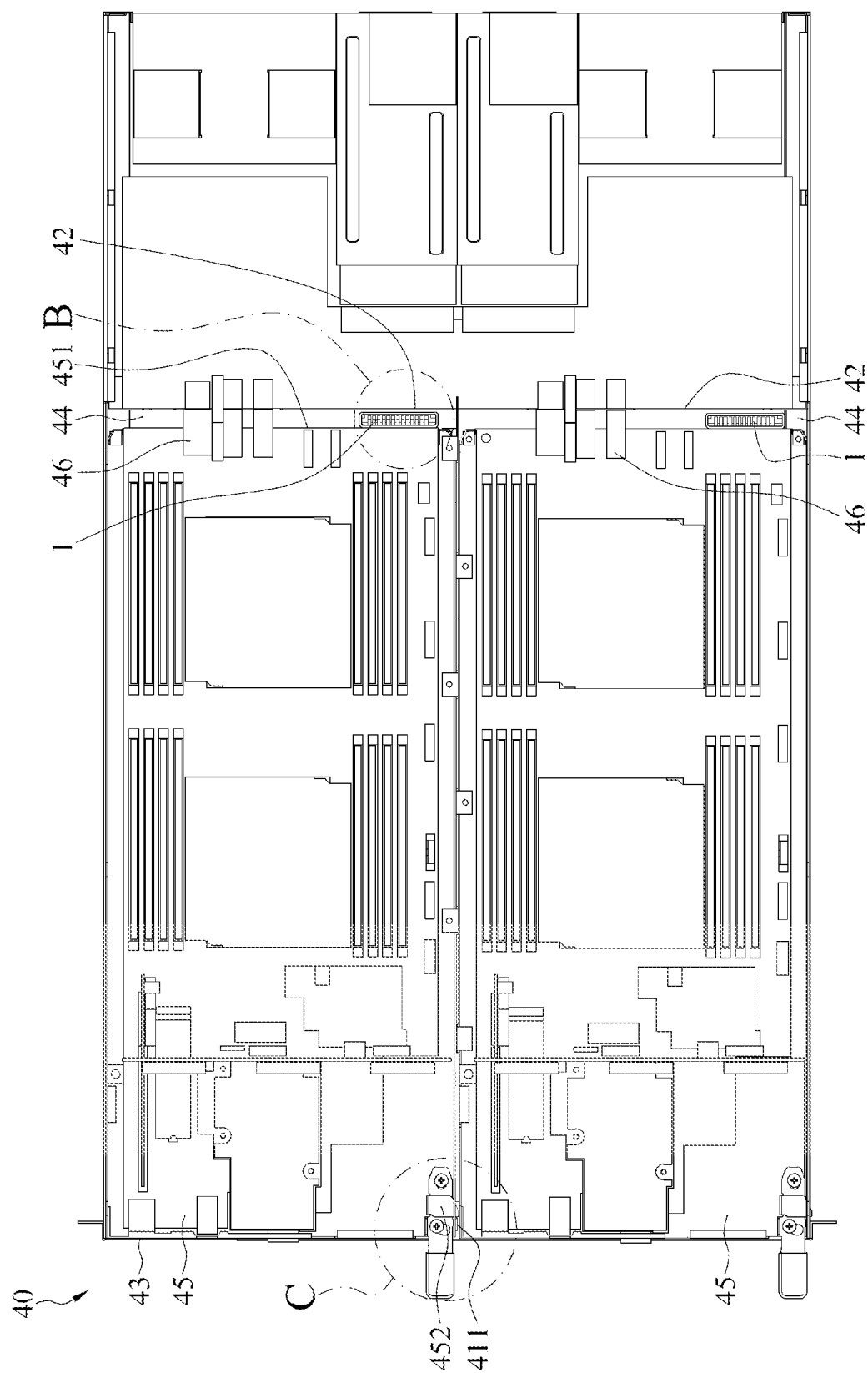
FIG. 10 illustrates a planar view of an embodiment of the electronic device according to the instant disclosure.
Figure 11:
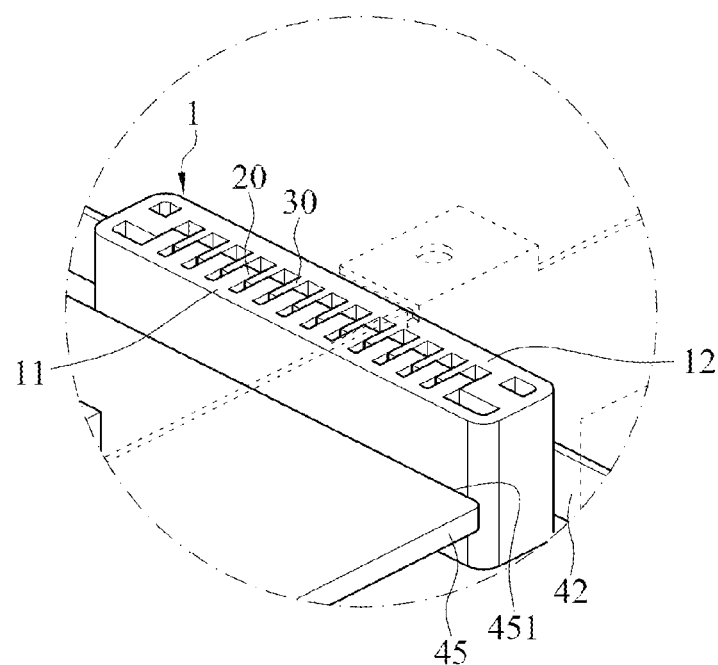
FIG. 11 illustrates a partially enlarged three-dimensional view of an embodiment of the electronic device according to the instant disclosure.
Figure 12:
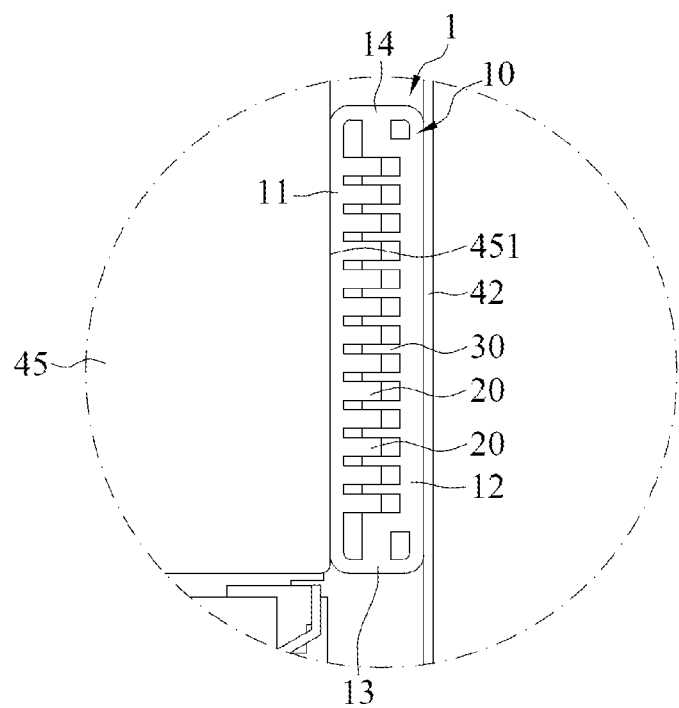
FIG. 12 illustrates a partially enlarged planar view of an embodiment of the electronic device according to the instant disclosure.

FIG. 9 to FIG. 14 show embodiments in which the cushioning element 1 in the foregoing embodiments is applied to an electronic device 40. FIG. 9 is an exploded three-dimensional view of an embodiment of an electronic device according to the instant disclosure. FIG. 10 is a planar view of an embodiment of the electronic device according to the instant disclosure. FIG. 11 is a partially enlarged three-dimensional view of an embodiment of the electronic device according to the instant disclosure, where FIG. 11 is a partial enlargement of a region A of FIG. 9. FIG. 12 is a partially enlarged planar view of an embodiment of the electronic device according to the instant disclosure, where FIG. 12 is a partial enlargement of a region B of FIG. 10. As shown in FIG. 9 and FIG. 10, the electronic device 40 includes a housing 41, a circuit board 45, and the cushioning element 1 in the foregoing embodiments. In some embodiments, the electronic device 40 may be a server, a computer, a home appliance, or another electronic product.

As shown in FIG. 9 and FIG. 10, for example, the electronic device 40 in this embodiment is a server, which is not intended to limit the instant disclosure. In some embodiments, the server may be a sled server, a blade server, a rack server, or the like.

As shown in FIG. 9 and FIG. 10, in some embodiments, the housing 41 of the electronic device 40 includes a connection portion 42 for fixing the cushioning element 1. There may be one or more connection portions 42 and cushioning elements 1, and the quantity depends on different product requirements. For example, in this embodiment, there are two connection portions 42 and two cushioning elements 1. In some embodiments, the connection portion 42 may be a bracket installed inside the housing 41, or a partial housing plate of the housing 41.

As shown in FIG. 9 to FIG. 12, there may be one or more circuit boards 45, which are assembled in the housing 41, and the circuit board 45 includes a side edge 451 adjacent to the connection portion 42. In this embodiment, there are two circuit boards 45. Each circuit board 45 is a pluggable circuit board, the housing 41 includes an assembly opening 43 and slot connectors 44, the quantity of the slot connectors 44 corresponds to the quantity of the circuit boards 45 and the slots 44 are located between the connection portion 42 and the assembly opening 43, and the each circuit board 45 is inserted into the corresponding slot connector 44 from the assembly opening 43.

As shown in FIG. 9 to FIG. 12, in some embodiments, after being inserted into the slot connector 44 of the housing 41, the circuit board 45 may be electrically connect to another element in the housing 41 by using a connector 46. For example, in this embodiment, a power supply board 47 is disposed in the housing 41 on a side far from the assembly opening 43, and the connector 46 is disposed on the side edge 451 of the circuit board 45 and is electrically connect to the power supply board 47, so that the circuit board 45 may be supplied with power by using the power supply board 47. Each connection portion 42 is located between the power supply board 47 and the side edge 451 of each circuit board 45, and there is a distance between the side edge 451 and the connection portion 42.

In some embodiments, there may be one or more cushioning elements 1, which are disposed between the side edge 451 of the circuit board 45 and the connection portion 42. As shown in FIG. 9 to FIG. 12, in this embodiment, there are a plurality of cushioning elements 1, and if the first side wall 11 of the hollow elastic body 10 of each cushioning element 1 is in contact with the side edge 451 of the each circuit board 45, the second side wall 12 is fixed to the connection portion 42. Therefore, when being subject to an external force (for example, being impacted or vibrated), the electronic device 40 is blocked between the connection portion 42 and the circuit board 45 by the cushioning element 1, so that a direct strike between the circuit board 45 and the connection portion 42 can be avoided, and the cushioning element 1 can further generate the damping effect to reduce the acceleration value when the circuit board 45 rebounds, to avoid damage or deformation of the circuit board or another element caused by rebound of the circuit board 45 on the another element in the housing 41.

Figure 13:
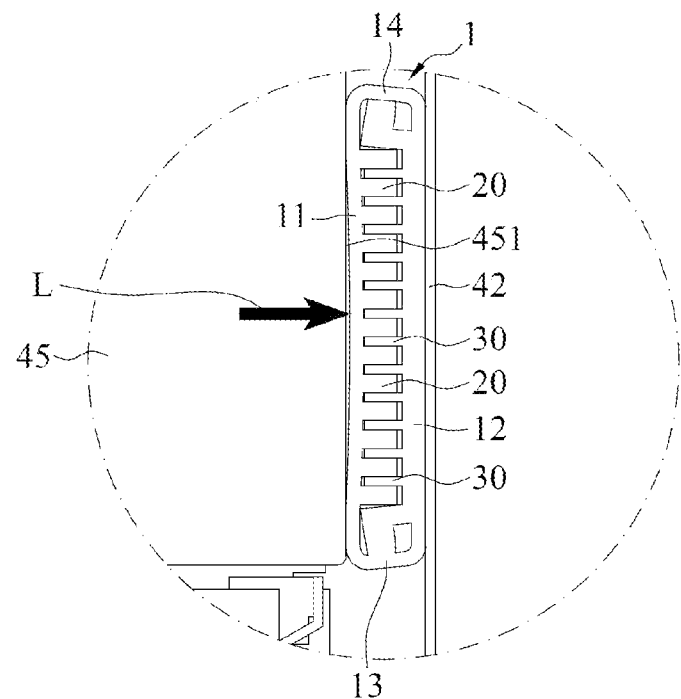
FIG. 13 illustrates a schematic diagram of an impact of FIG. 12.

For example, referring to FIG. 2, FIG. 12, and FIG. 13 at the same time, FIG. 13 is a schematic diagram of an impact of FIG. 12. Before being shipped, the electronic device 40 needs to be subject to impact or vibration tests, to ensure product reliability. In the impact or vibration process, because the first side wall 11 of the cushioning element 1 is in contact with the side edge 451 of the circuit board 45, so that when the circuit board 45 in the electronic device 40 is stressed to generate an acceleration, the side edge 451 of the circuit board 45 correspondingly impacts the first side wall 11 of the cushioning element 1 (as indicated by an arrow L in FIG. 13), so that the first side wall 11 and the each first column 20 move closer toward the second inner surface 121 to compress the hollow elastic body 10. In the moving process, portions of the first side surface 22 of the each first column 20 and the second side surface 32 of the each second column 30 that are in contact with each other rub against each other to generate a damping effect. In addition, the side walls (the first side wall 11, the third side wall 13, and the fourth side wall 14) of the hollow elastic body 10 may be simultaneously stressed to be deformed to enhance the damping effect, to effectively absorb an impact force of the circuit board 45 and greatly reduce a rebound reacting force, so that a rebound acceleration value of the circuit board 45 is reduced, to avoid damage or deformation of the circuit board or another element caused by rebound of the circuit board 45 on the another element in the housing 41.

Figure 14:
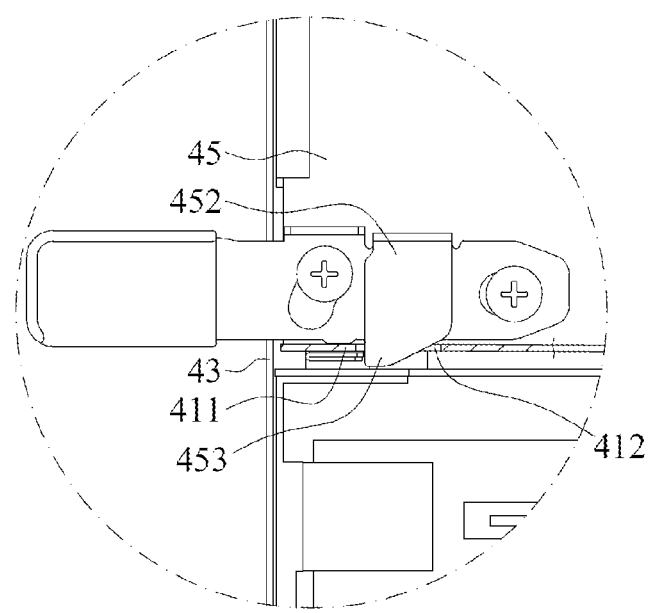
FIG. 14 illustrates another partially enlarged planar view of an embodiment of the electronic device according to the instant disclosure.

Based on the above, as shown in FIG. 10 and FIG. 14, FIG. 14 is a partial enlargement of a region C of FIG. 10. In some embodiments, the each circuit board 45 may include a first stop member 452, the housing 41 may include a second stop member 411, the second stop member 411 is located between the first stop member 452 and the assembly opening 43, and the first stop member 452 abuts against the second stop member 411, so that the each circuit board 45 is limited and is prevented from being separated from the assembly opening 43. As described above, the cushioning element 1 can effectively absorb the impact force of the circuit board 45 and greatly reduce the rebound reacting force, thereby reducing the rebound acceleration value of the circuit board 45. Therefore, a force of striking the second stop member 411 of the housing 41 by the first stop member 452 of the circuit board 45 can be greatly reduced, to avoid damage or deformation of the first stop member 452 and the second stop member 411.

In some embodiments, as shown in FIG. 10 and FIG. 14, the first stop member 452 of the each circuit board 45 may be a toggle, which is disposed on an opposite side of the side edge 451, and the first stop member 452 includes a buckling portion 453. The second stop member 411 of the housing 41 is a blocking plate, which is disposed at the assembly opening 43, and the second stop member 411 includes a buckling slot 412. The first stop member 452 may be toggled to swing relative to the second stop member 411, so that the buckling portion 453 is buckled or separated from the buckling slot 412. For example, when the circuit board 45 is inserted into the corresponding slot connector 44 from the assembly opening 43, the first stop member 452 may be toggled to swing, so that the buckling portion 453 is buckled in the buckling slot 412, and the first stop member 452 and the second stop member 411 are mutually abutted and limited, to prevent the circuit board 45 from falling out. When the circuit board 45 is to be detached from the housing 41, the first stop member 452 may be toggled to swing, so that the buckling portion 453 is separated from the buckling slot 412, to take out the circuit board 45 from the assembly opening 43.

In some embodiments, the cushioning element 1 may be alternatively disposed between each side edge of the each circuit board 45 and the housing 41, so that when the each circuit board 45 is stressed to generate accelerations in a plurality of axial directions, the cushioning effect can be obtained by using the cushioning element 1.

In some embodiments, the hollow elastic body 10 of the each cushioning element 1 may alternatively be fixed to the connection portion 42 by using the first side wall 11, and the second side wall 12 is in contact with the side edge 451 of the each circuit board 45, so that the impact on the circuit board 45 is borne by the second side wall 12.

Although the instant disclosure has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A cushioning element, comprising:
   a hollow elastic body, comprising a first side wall and a second side wall, wherein the first side wall comprises a first inner surface, and the second side wall comprises a second inner surface;
   a plurality of first columns, disposed on the first inner surface, wherein each of the first columns comprises a first extending end and a first side surface, and there is a first distance between the first extending end and the second inner surface; and
   a plurality of second columns, disposed on the second inner surface, wherein each of the second columns comprises a second extending end and a second side surface, there is a second distance between the second extending end and the first inner surface, and the second side surface and the first side surface are at least partially in contact with each other.

2. The cushioning element according to claim 1, wherein the first columns are arranged in a row, the second columns are arranged in a row, and the first columns and the second columns are alternately disposed.

3. The cushioning element according to claim 1, wherein the hollow elastic body comprises a first opening side and a second opening side opposite to each other, and each of the first columns is in a long strip shape and extends from the first opening side to the second opening side.

4. The cushioning element according to claim 1, wherein the hollow elastic body comprises a third side wall and a fourth side wall opposite to each other, the third side wall and the fourth side wall are connected between the first side wall and the second side wall, and two of the second columns are further connected to the third side wall and the fourth side wall respectively.

5. The cushioning element according to claim 4, wherein each of the second columns connected to the third side wall and the fourth side wall is further provided with a slot.

6. The cushioning element according to claim 1, wherein the first columns are arranged in a two-dimensional array, the second columns are arranged in a two-dimensional array, and the first columns and the second columns are alternately disposed.

7. The cushioning element according to claim 1, wherein a plurality of convex portions are further provided on the first side surface of each of the first columns, a plurality of concave portions are further provided on the second side surface of each of the second columns, and the convex portions are detachably accommodated in the concave portions respectively.

8. The cushioning element according to claim 7, wherein each convex portion comprises a first inclined plane and a second inclined plane, the first inclined plane is adjacent to the first inner surface relative to the second inclined plane, and an inclination of the first inclined plane is greater than an inclination of the second inclined plane.

9. An electronic device, comprising:
   a housing, comprising a connection portion;
   a circuit board, assembled in the housing; and
   a cushioning element, disposed between the circuit board and the connection portion, wherein the cushioning element comprises:
      a hollow elastic body, comprising a first side wall and a second side wall, wherein the first side wall comprises a first inner surface, the second side wall comprises a second inner surface, the first side wall is in contact with the circuit board, and the second side wall is fixed to the connection portion;
      a plurality of first columns, disposed on the first inner surface, wherein each of the first columns comprises a first extending end and a first side surface, and there is a first distance between the first extending end and the second inner surface; and
      a plurality of second columns, disposed on the second inner surface, wherein each of the second columns comprises a second extending end and a second side surface, there is a second distance between the second extending end and the first inner surface, and the second side surface and the first side surface are at least partially in contact with each other.

10. The electronic device according to claim 9, wherein the circuit board comprises a side edge adjacent to the connection portion, the first side wall is in contact with the side edge.

11. The electronic device according to claim 9, wherein the housing comprises a slot connector, the circuit board is inserted into the slot connector.

12. The electronic device according to claim 11, wherein the housing comprises an assembly opening, the slot connector is located between the connection portion and the assembly opening, and the circuit board is inserted into the slot connector from the assembly opening.

13. The electronic device according to claim 12, wherein the circuit board comprises a first stop member, the housing comprises a second stop member, the second stop member is located between the first stop member and the assembly opening, and the first stop member abuts against the second stop member.

14. The electronic device according to claim 9, wherein the first columns are arranged in a row, the second columns are arranged in a row, and the first columns and the second columns are alternately disposed.

15. The electronic device according to claim 9, wherein the hollow elastic body comprises a first opening side and a second opening side opposite to each other, and each of the first columns is in a long strip shape and extends from the first opening side to the second opening side.

16. The electronic device according to claim 9, wherein the hollow elastic body comprises a third side wall and a fourth side wall opposite to each other, the third side wall and the fourth side wall are connected between the first side wall and the second side wall, and two of the second columns are further connected to the third side wall and the fourth side wall respectively.

17. The electronic device according to claim 16, wherein each of the second columns connected to the third side wall and the fourth side wall is further provided with a slot.

18. The electronic device according to claim 9, wherein the first columns are arranged in a two-dimensional array, the second columns are arranged in a two-dimensional array, and the first columns and the second columns are alternately disposed.

19. The electronic device according to claim 9, wherein a plurality of convex portions are further provided on the first side surface of each of the first columns, a plurality of concave portions are further provided on the second side surface of each of the second columns, and the convex portions are detachably accommodated in the concave portions respectively.

20. The electronic device according to claim 19, wherein each convex portion comprises a first inclined plane and a second inclined plane, the first inclined plane is adjacent to the first inner surface relative to the second inclined plane, and an inclination of the first inclined plane is greater than an inclination of the second inclined plane.

* * * * *